(12) United States Patent
Shim et al.

(10) Patent No.: US 10,047,614 B2
(45) Date of Patent: Aug. 14, 2018

(54) COATING SYSTEM INCLUDING ALTERNATING LAYERS OF AMORPHOUS SILICA AND AMORPHOUS SILICON NITRIDE

(71) Applicant: Rolls-Royce Corporation, Indianapolis, IN (US)

(72) Inventors: Sungbo Shim, Irvine, CA (US); Sean E. Landwehr, Avon, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 74 days.

(21) Appl. No.: 14/879,931

(22) Filed: Oct. 9, 2015

(65) Prior Publication Data

US 2016/0102555 A1    Apr. 14, 2016

Related U.S. Application Data (60) Provisional application No. 62/061,981, filed on Oct. 9, 2014.

(51) Int. Cl.
*F01D 5/28* (2006.01)
*C04B 41/50* (2006.01)
(Continued)

(52) U.S. Cl.
CPC ............ *F01D 5/3092* (2013.01); *C04B 41/52* (2013.01); *C04B 41/522* (2013.01); *C04B 41/524* (2013.01); *C04B 41/89* (2013.01); *C23C 16/345* (2013.01); *C23C 16/402* (2013.01); *C23C 16/50* (2013.01); *F01D 5/282* (2013.01);
(Continued)

(58) Field of Classification Search
CPC ..................................................... F01D 5/3092
See application file for complete search history.

(56) References Cited

U.S. PATENT DOCUMENTS 3,764,189 A * 10/1973 Prostler ................... F01D 5/288
                                                                    384/278
3,874,915 A     4/1975 Ono et al.
(Continued)

FOREIGN PATENT DOCUMENTS

DE      102009058853 A1 *  6/2011  ............. F01D 5/288
DE      102016201523 A1 *  8/2017  ............... F01D 5/08
(Continued)

OTHER PUBLICATIONS

NPL on silica from MIT Material Property Database, http://www.mit.edu/~6.777/matprops/sio2.htm, retrieved on Apr. 17, 2017.*
(Continued)

*Primary Examiner* — Z. Jim Yang
(74) *Attorney, Agent, or Firm* — Shumaker & Sieffert, P.A.

(57) ABSTRACT

In some examples, an article may include a substrate and a coating on the substrate. The substrate may include a superalloy, a ceramic, or a ceramic matrix composite. The coating may include a first set of layers and a second set of layers. At least one layer of the first set of layers is between two layers of the second set of layers. The at least one layer of the first set of layers comprises one of amorphous silica or silicon nitride, and the at least two layers of the second set of layers comprises the other of amorphous silica or silicon nitride.

19 Claims, 3 Drawing Sheets

(51) Int. Cl.
*C04B 41/85* (2006.01)
*C04B 41/89* (2006.01)
*F01D 5/30* (2006.01)
*C23C 16/50* (2006.01)
*C23C 16/34* (2006.01)
*C23C 16/40* (2006.01)
*C04B 41/52* (2006.01)

(52) U.S. Cl.
CPC ........ *F01D 5/284* (2013.01); *F05D 2300/175* (2013.01); *F05D 2300/211* (2013.01); *F05D 2300/2283* (2013.01); *F05D 2300/6033* (2013.01)

(56) References Cited

U.S. PATENT DOCUMENTS

| | | | |
|---|---|---|---|
| 3,897,171 A * | 7/1975 | Stahl | F01D 5/22 416/213 R |
| 4,397,901 A | 8/1983 | Warren | |
| 4,417,854 A * | 11/1983 | Cain | F01D 5/284 416/219 R |
| 4,671,997 A * | 6/1987 | Galasso | C04B 41/009 428/408 |
| 4,697,325 A * | 10/1987 | Kamigaito | C04B 37/026 29/447 |
| 4,855,262 A | 8/1989 | Richon et al. | |
| 4,877,641 A | 10/1989 | Dory | |
| 4,877,651 A | 10/1989 | Dory | |
| 4,971,655 A | 11/1990 | Stefano et al. | |
| 5,358,797 A * | 10/1994 | Matsunuma | C04B 35/593 123/81 R |
| 5,534,308 A | 7/1996 | Bamberg et al. | |
| 5,897,920 A | 4/1999 | Sileo et al. | |
| 6,132,175 A * | 10/2000 | Cai | F01D 5/284 403/29 |
| 6,335,105 B1 | 1/2002 | McKee | |
| 6,532,657 B1 | 3/2003 | Weimer et al. | |
| 6,641,907 B1 | 11/2003 | Merrill et al. | |
| 6,682,821 B2 | 1/2004 | Fukudome et al. | |
| 6,689,487 B2 | 2/2004 | Murphy | |
| 6,733,907 B2 | 5/2004 | Morrison et al. | |
| 6,893,750 B2 | 5/2005 | Nagaraj et al. | |
| 6,926,928 B2 | 8/2005 | Ackerman et al. | |
| 6,976,532 B2 | 12/2005 | Zhan et al. | |
| 7,306,828 B2 | 12/2007 | Barrera et al. | |
| 7,629,033 B2 | 12/2009 | Hongo et al. | |
| 7,666,515 B2 | 2/2010 | Nagaraj et al. | |
| 7,730,808 B2 | 6/2010 | Chiu et al. | |
| 7,763,367 B2 | 7/2010 | Arndt et al. | |
| 7,942,638 B2 | 5/2011 | Eichmann et al. | |
| 8,012,252 B2 | 9/2011 | Engler et al. | |
| 8,021,758 B2 | 9/2011 | Sambasivan et al. | |
| 8,034,153 B2 | 10/2011 | Marchiando et al. | |
| 8,361,627 B2 | 1/2013 | Hack et al. | |
| 8,486,520 B2 | 7/2013 | Lima et al. | |
| 8,512,871 B2 | 8/2013 | Persky et al. | |
| 8,721,812 B2 | 5/2014 | Furrer et al. | |
| 2005/0042461 A1* | 2/2005 | Li | C04B 41/009 428/446 |
| 2006/0188736 A1 | 8/2006 | Luthra et al. | |
| 2007/0099027 A1 | 5/2007 | Krishnamurthy et al. | |
| 2007/0128447 A1 | 6/2007 | Hazel et al. | |
| 2007/0184298 A1 | 8/2007 | Ochiai et al. | |
| 2007/0224359 A1 | 9/2007 | Burin et al. | |
| 2007/0228664 A1 | 10/2007 | Anand et al. | |
| 2008/0038578 A1 | 2/2008 | Li | |
| 2009/0060745 A1* | 3/2009 | Douguet | F01D 5/3007 416/219 R |
| 2009/0104041 A1* | 4/2009 | Bruce | C23C 8/20 416/241 R |
| 2009/0214787 A1 | 8/2009 | Wei et al. | |
| 2010/0119718 A1 | 5/2010 | Tulyani et al. | |
| 2010/0158680 A1* | 6/2010 | Kirby | C04B 41/009 415/200 |
| 2011/0124253 A1 | 5/2011 | Shah et al. | |
| 2012/0114956 A1 | 5/2012 | Ochiai et al. | |
| 2012/0251742 A1 | 10/2012 | Kerber | |
| 2013/0004309 A1 | 1/2013 | Sambasivan et al. | |
| 2013/0071248 A1* | 3/2013 | Hogberg | F01D 5/22 416/221 |
| 2013/0101745 A1* | 4/2013 | Meillot | C23C 4/00 427/455 |
| 2013/0177772 A1 | 7/2013 | Schaeffer et al. | |
| 2014/0234117 A1* | 8/2014 | Cairo | C04B 35/117 416/241 R |
| 2015/0218954 A1* | 8/2015 | Witz | F01D 5/282 416/213 R |
| 2015/0259787 A1* | 9/2015 | Shim | C23C 14/34 428/623 |
| 2016/0017723 A1* | 1/2016 | McCaffrey | F01D 5/3007 415/200 |
| 2016/0040539 A1* | 2/2016 | McCaffrey | F01D 5/147 60/805 |
| 2016/0102407 A1* | 4/2016 | Shim | C23C 28/048 428/329 |
| 2016/0289855 A1* | 10/2016 | Task | C25D 5/14 |
| 2017/0218768 A1* | 8/2017 | Boeck | F01D 5/02 |

FOREIGN PATENT DOCUMENTS

| | | | | |
|---|---|---|---|---|
| JP | | 2010180819 A | * | 8/2010 |
| JP | | 2013217227 A | * | 10/2013 |
| WO | WO 2014143364 A2 | * | 9/2014 | ............ F01D 5/3007 |

OTHER PUBLICATIONS

NPL on silicon nitride from Accuratus, http://accuratus.com/silinit.html, retrieved on Apr. 17, 2017.*

NPL on glass from MIT Open Courseware, https://ocw.mit.edu/courses/materials-science-and-engineering/3-091sc-introduction-to-solid-state-chemistry-fall-2010/amorphous-materials/21-introduction-to-glasses/, retrieved on Apr. 17, 2017.*

* cited by examiner

COATING SYSTEM INCLUDING ALTERNATING LAYERS OF AMORPHOUS SILICA AND AMORPHOUS SILICON NITRIDE

RELATED APPLICATIONS

This application claims the benefit of U.S. Provisional Application No. 62/061,981, titled, "COATING SYSTEM INCLUDING ALTERNATING LAYERS OF AMORPHOUS SILICA AND AMORPHOUS SILICON NITRIDE," filed Oct. 9, 2014, the entire content of which is incorporated herein by reference.

TECHNICAL FIELD

The disclosure relates to coatings for superalloy substrates, ceramic substrates, or ceramic matrix composite substrates.

BACKGROUND

Gas turbine engines include compressor blades that rotate to compress inlet gases and turbine blades that rotate to harness energy from expansion of outlet gases. Gas turbine engine blades are attached to gas turbine engine disks. The gas turbine engine disks rotate with the gas turbine engine blades and may experience peak stresses in excess of about 1000 megapascals (MPa) due to centrifugal loading from the gas turbine engine blades and weight of the gas turbine engine disks themselves.

In some examples, gas turbine engine disks may not be directly exposed to the flow path of hot gases in the gas turbine engine. Thus, in some implementations, maximum surface temperatures of the gas turbine engine disks may be about 650° C. The thermal and mechanical stresses to which the gas turbine engine disks are exposed impose design criteria which the alloys that form the gas turbine engine disks may satisfy. These design criteria include relatively high yield strength and tensile strength to inhibit yield and fracture of the gas turbine disk, relatively high ductility and fracture toughness to impart tolerance to defects, relatively high resistance to initiation of fatigue cracks, and relatively low fatigue crack propagation rates. In some implementations, gas turbine disks may be formed from nickel (Ni)-based superalloys, which may satisfy at least some of these design criteria.

In some examples, gas turbine engines may include some components formed from alloys and some components formed from ceramics or ceramic matrix composites (CMCs). The alloy components and ceramic or CMC composites may contact each other.

SUMMARY

The disclosure describes an article that includes a substrate and a coating including alternating layers, with at least two of the alternating layers including an amorphous microstructure. The alternating layers may include a first set of layers including amorphous silica and a second set of layers including amorphous silicon nitride. Respective layer(s) from the first set of layers may alternate with respective layer(s) from the second set of layers. In general, the coating may include at least two layers (e.g., one layer including amorphous silica and one layer including amorphous silicon nitride). In some examples, the coating may include at least three layers (e.g., at least two layers including amorphous silica and at least one layer include amorphous silicon nitride or at least two layers including amorphous silicon nitride and at least one layer including amorphous silica).

In some examples, the article includes a gas turbine engine disk, e.g., a compressor disk or a turbine disk. The coating may be applied to one or more portions of the gas turbine engine disk, such surfaces of the fir tree recess, a surface of a diaphragm of the gas turbine engine disk, or a surface of an outer rim of the gas turbine engine disk. The coating may be a wear-resistant coating or provide hot corrosion protection, oxidation protection, or both to the gas turbine engine disk.

In some examples, a system may include an alloy component in contact with a ceramic or CMC component. One or both of the alloy component may include the coating that includes alternating layers including amorphous microstructure. The coating may be on the alloy component, the ceramic or CMC component, or both, at portions of the component(s) that contact each other. In some examples, the coating may reduce or substantially prevent diffusion of silicon from the ceramic or CMC component into the alloy component.

In some examples, the disclosure describes an article including a substrate and a coating on the substrate. In accordance with these examples, the coating may include a first set of layers and a second set of layers. At least one layer of the first set of layers is between two layers of the second set of layers. The at least one layer of the first set of layers may include one of amorphous silica or silicon nitride, and the at least two layers of the second set of layers may include the other of amorphous silica or silicon nitride.

In some examples, the disclosure describes a system including a first component including an alloy substrate and a second component including a ceramic or a CMC substrate. In accordance with these examples, at least a portion of the first component is in contact with at least a portion of the second component, and the at least a portion of the first component, the at least a portion of the second component, or both comprises a coating. In some examples, the coating comprises a first set of layers and a second set of layers. At least one layer of the first set of layers is between two layers of the second set of layers. The at least one layer of the first set of layers may include one of amorphous silica or silicon nitride, and the at least two layers of the second set of layers may include the other of amorphous silica or silicon nitride.

In some examples, the disclosure describes a method including depositing, using at least one of chemical vapor deposition or plasma-enhanced chemical vapor deposition, a plurality of layers comprising an amorphous microstructure on a substrate. In accordance with these examples, the plurality of layers comprises a first set of layers and a second set of layers. At least one layer of the first set of layers is between two layers of the second set of layers. The at least one layer of the first set of layers may include one of amorphous silica or silicon nitride, and the at least two layers of the second set of layers may include the other of amorphous silica or silicon nitride.

The details of one or more examples are set forth in the accompanying drawings and the description below. Other features, objects, and advantages will be apparent from the description and drawings, and from the claims.

DETAILED DESCRIPTION

The disclosure describes an article that includes a substrate and a coating including alternating layers, with at least one of the layers including amorphous microstructure. The alternating layers may include a first set of layers including amorphous silica and a second set of layers including amorphous silicon nitride. Respective layer(s) from the first set of layers may alternate with respective layer(s) from the second set of layers. In general, the coating may include at least two layers (e.g., one layer including amorphous silica and one layer including amorphous silicon nitride). In some examples, the coating may include at least three layers (e.g., at least two layers including amorphous silica and at least one layer include amorphous silicon nitride or at least two layers including amorphous silicon nitride and at least one layer including amorphous silica).

In some examples, the article includes a gas turbine engine disk, e.g., a compressor disk or a turbine disk. The coating may be applied to one or more portions of the gas turbine engine disk, such surfaces of the fir tree recess, a surface of a diaphragm of the gas turbine engine disk, or a surface of an outer rim of the gas turbine engine disk. In some examples, the coating may be reduce wear between the gas turbine engine disk and a gas turbine engine blade or vane. In other examples, the coating may provide hot corrosion protection, oxidation protection, or both to the gas turbine engine disk.

In some examples, a system, such as a high temperature mechanical system, may include an alloy component in contact with a ceramic or CMC component. One or both of the alloy component or the ceramic or CMC component may include the coating that includes alternating layers including amorphous microstructure. The coating may be on the alloy component, the ceramic or CMC component, or both, at portions of the component(s) that contact each other. In some examples, the coating may reduce or substantially prevent diffusion of silicon from the ceramic or CMC component into the alloy component.

Figure 1:
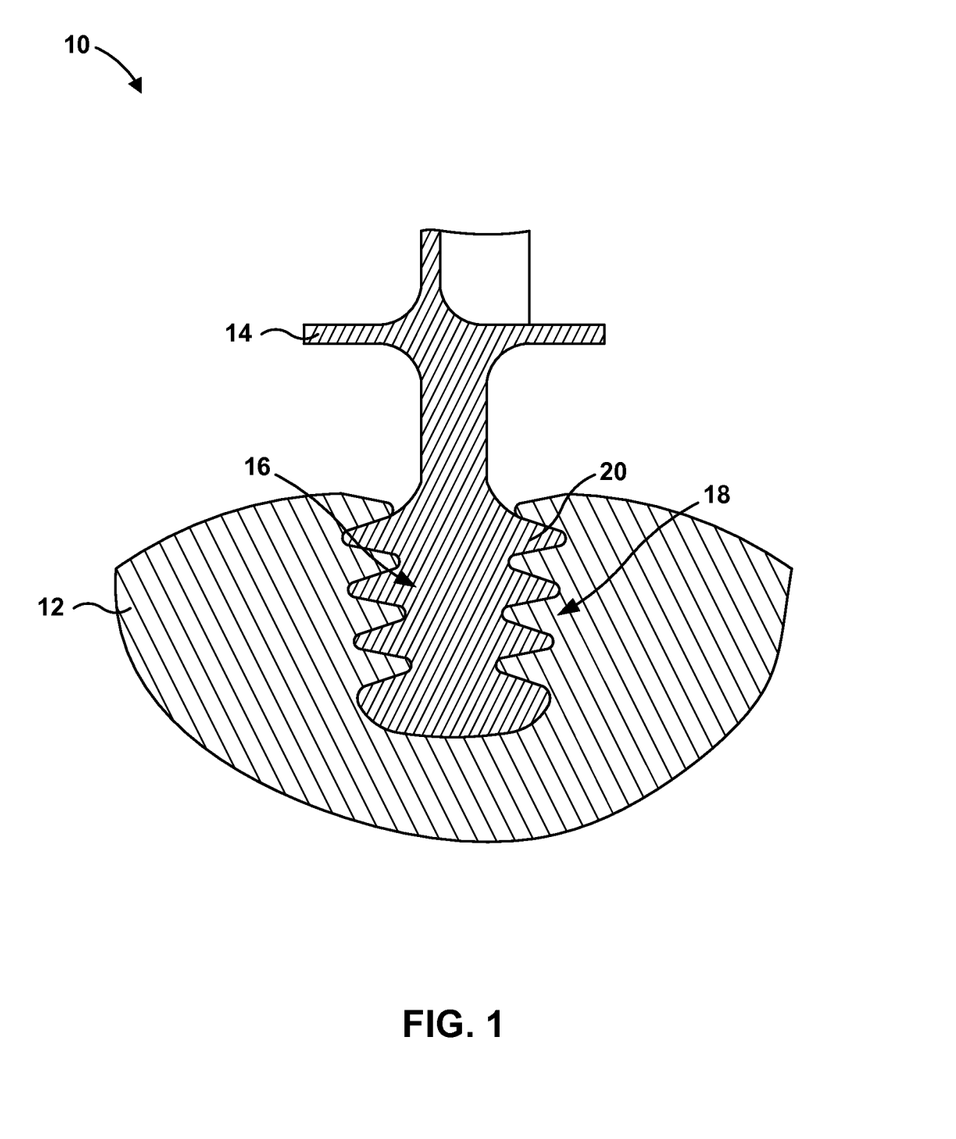
FIG. 1 is a conceptual diagram illustrating a cross-sectional view of an example article that includes a gas turbine engine disk and a gas turbine engine blade.

FIG. 1 is a conceptual diagram illustrating a cross-sectional view of an example article 10 that includes a gas turbine engine disk 12 and a gas turbine engine blade 14. In gas turbine engines, turbine blades 14 may be connected to turbine disks 12 using fir tree connections. In such connections, each gas turbine engine blade 14 has a dovetail or blade root 16 that is inserted into a fir tree recess 18 formed in gas turbine engine disk 12. The facing sides of blade root 16 and fir tree recess 18 have respective serrations 20, which may take the form of projections and grooves extending in the direction of insertion of blade root 16 into fir tree recess 18. In this way, the fir tree connection may prevent gas turbine engine blade 14 from flying outwardly from gas turbine engine disk 12 during operation of the gas turbine engine and rotation of gas turbine engine blade 14 and disk 12.

Surfaces of blade root 16 and fir tree recess 18 form contact points between gas turbine engine disk 12 and gas turbine engine blade 14. During operation of the gas turbine engine, gas turbine engine disk 12 and gas turbine engine blade 14 may rub against each other at these contact points due to relative motion between gas turbine engine disk 12 and gas turbine engine blade 14. In some examples, the rubbing between gas turbine engine disk 12 and gas turbine engine blade 14 at these contact points may result in fretting.

In accordance with some examples of this disclosure, a coating may be applied to a gas turbine engine disk 12. In some examples, the coating may be selectively applied to gas turbine engine disk 12 at points of contact between gas turbine engine disk 12 and gas turbine engine blade 14. For example, the coating may be applied to the surface of fir tree recess 18. The coating may include a plurality of layers including amorphous oxides. For example, the amorphous oxides may include silica ($SiO_2$) and silicon nitride ($Si_3N_4$). The coating may be resistant to mechanical wear due to rubbing between fir tree recess 18 of gas turbine engine disk 12 and gas turbine engine blade 14. In some examples, this may reduce fretting of gas turbine engine disk 12, gas turbine engine blade 14, or both. In some examples, the coating is selectively not on surfaces of gas turbine engine disk 12 other than the surfaces of fir tree recess 18.

In some examples, instead of or in addition to being on the surface of fir tree recess 18, the coating may be applied to other portions of gas turbine engine disk 12. For example, the coating may be applied to a portion of gas turbine engine disk 12 that is exposed to hot gases during operation of the gas turbine engine. These portions of gas turbine engine disk 21 may include a diaphragm, an outer rim, or both. In some examples, the coating may provide hot corrosion resistance, oxidation protection, or both to gas turbine engine disk 12.

Figure 2:
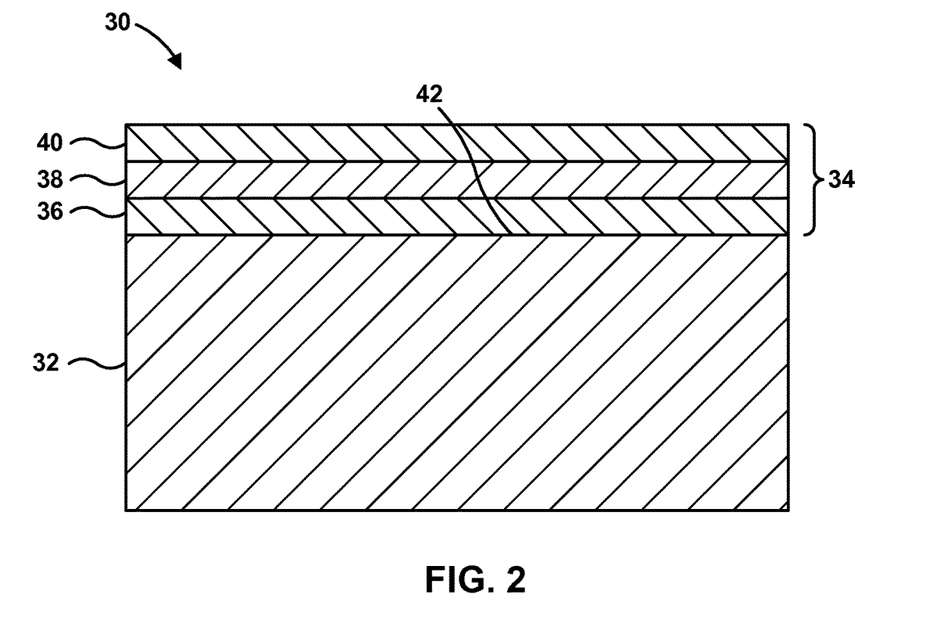
FIG. 2 is a conceptual diagram illustrating a cross-sectional view of an example article that includes a substrate and a coating including alternating layers including amorphous microstructure.

FIG. 2 is a conceptual diagram illustrating a cross-sectional view of an example article 30 that includes a substrate 32 coated with a coating 34. In some examples, article 30 may be an example of gas turbine engine disk 12, such as a portion of fir tree recess 18, a diaphragm of gas turbine engine disk 12, or an outer rim of gas turbine engine disk 12. In the example illustrated in FIG. 2, coating 34 includes a first layer 36 on substrate 32 and a second layer 38 on first layer 36, and a third layer 40 second layer 38.

In some examples, substrate 32 may include a superalloy, such as a Ni-based or Co-based superalloy. In some examples, substrate 32 includes a Ni-based superalloy suitable for use in a gas turbine engine disk or gas turbine engine spacer. As described above, the superalloy from which a gas turbine engine disk is formed may satisfy certain design criteria, including, for example, relatively high yield strength and tensile strength to inhibit yield and fracture of the gas turbine engine disk, relatively high ductility and fracture toughness to impart tolerance to defects, relatively high resistance to initiation of fatigue cracks, and relatively low fatigue crack propagation rates.

Properties of the superalloy from which substrate 32 is formed may be a function of the composition of the superalloy and the phase constitution and microstructure of the superalloy. The microstructure of the superalloy may include the grain size of the superalloy and a precipitate phase composition, size, and volume fraction. In some examples, the phase constitution and microstructure of the superalloy may be affected by mechanical and thermal processing of the superalloy. For example, thermal processing, e.g., heat treatment, of the superalloy may affect grain structure of the superalloy, precipitate phase size and/or composition, or the like.

In some examples, substrate 32 includes a polycrystalline Ni-based superalloy, which includes a plurality of grains. Substrate 32 may include at least one of Al, Ti, or Ta in addition to Ni. In some examples, a concentration of elements, such as between about 2 weight percent (wt. %) and about 5 wt. % Al, between about 2 wt. % and about 5 wt. % Ti, and less than about 3 wt. % tantalum (Ta), in substrate 32 may be sufficient to result in gamma-prime (γ') precipitate formation in substrate 32. For example, the concentration of Al, Ti, and/or Ta in substrate 32 may result in a γ' precipitate phase volume fraction between about 40 volume percent (vol. %) and about 55 vol. %. In some instances, higher or lower elemental contents of the individual gamma prime forming elements can be employed while maintaining the overall gamma prime phase fraction at desired levels for properties such as strength and ductility. The volume fraction, size, and distribution of the γ' precipitate phase may be influenced by the alloy composition, heat treatment temperature, heat treatment duration, and cooling rate during heat treatment. Additionally, substrate 32 may include grain sizes between about 5 micrometers (μm) in diameter to between about 30 μm and about 50 μm or more in diameter, engineered for a combination of yield strength, resistance to fatigue crack initiation, creep strength, and resistance to fatigue crack growth. In some examples, substrate 32 may include additional elements that segregate to grain boundaries of substrate 32. The segregating elements may affect creep resistance and low-cycle fatigue resistance of substrate 32. Examples of segregating elements include boron (B; up to about 0.03 weight percent (wt. %) of substrate 12), carbon (C; up to about 0.05 wt. % of substrate 32), and zirconium (Zr; up to about 0.1 wt. % of substrate 32). Examples of compositions and heat treatment techniques that may result in suitable Ni-based disk alloys are described in U.S. patent application Ser. No. 12/755,170, entitled "TECHNIQUES FOR CONTROLLING PRECIPITATE PHASE DOMAIN SIZE IN AN ALLOY," and filed Apr. 6, 2010, the entire content of which is incorporated herein by reference.

In an example, substrate 32 may include a Ni-based superalloy with a composition of about 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni (about 52.3 wt. % Ni).

Example superalloys include RR1000 (a Ni-based superalloy containing about 52.4 mass percent (mas. %) Ni, about 15 mas. % Cr, about 18.5 mas. % Co, about 5 mas. % Mo, about 3.6 mas. % Ti, about 3 mas. % Al, about 2 mas. % Ta, about 0.5 mas. % Hf, and about 0.03 mas. % C); UDIMET® alloy 720, available from Special Metals Corporation (a Ni-based alloy including between 15.5 and 16.5% Cr, between 14 and 15.5% Co, between 2.75 and 3.25% Mo, between 1.00 and 1.50% W, between 4.75 and 5.25% Ti, between 2.25 and 2.75% Al, between 0.01 and 0.02% C, between 0.025 and 0.05% Zr, between 0.01 and 0.02% B, and a balance Ni); those available from Martin-Marietta Corp., Bethesda, Md., under the trade designation MAR-M247; those available from Cannon-Muskegon Corp., Muskegon, Mich., under the trade designation CMSX-3 and CMXS-4; and the like.

In other examples, substrate 32 may include a ceramic or ceramic matrix composite. In some examples in which substrate 32 includes a ceramic, the ceramic may be substantially homogeneous. In some examples, a substrate 32 that includes a ceramic includes, for example, a Si-containing ceramic, such $SiO_2$, silicon carbide (SiC) or silicon nitride ($Si_3N_4$); $Al_2O_3$; aluminosilicate (e.g., $Al_2SiO_5$); or the like. In other examples, substrate 32 includes a metal alloy that includes Si, such as a molybdenum-silicon alloy (e.g., $MoSi_2$) or a niobium-silicon alloy (e.g., $NbSi_2$).

In examples in which substrate 32 includes a CMC, substrate 32 includes a matrix material and a reinforcement material. The matrix material includes a ceramic material, such as, for example, SiC, $Si_3N_4$, $Al_2O_3$, aluminosilicate, $SiO_2$, or the like. The CMC further includes a continuous or discontinuous reinforcement material. For example, the reinforcement material may include discontinuous whiskers, platelets, or particulates. As other examples, the reinforcement material may include a continuous monofilament or multifilament weave. In some examples, substrate 32 may include a SiC reinforcement material in a SiC matrix material.

First layer 36 and third layer 40 may include a first chemical composition. In some examples, first layer 36 and third layer 40 may include amorphous (glassy) silica ($SiO_2$). In some examples in which first layer 36 and third layer 40 include amorphous silica, first layer 36 and third layer 40 may consist essentially of amorphous silica or consist of amorphous silica. In some examples in which first layer 36 and third layer 40 include amorphous silica, first layer 36 and third layer 40 may not include (e.g., be substantially free of) silicon nitride.

In other examples, first layer 36 and third layer 40 may include amorphous (glassy) silicon nitride ($Si_3N_4$). In some examples in which first layer 36 and third layer 40 include amorphous silicon nitride, first layer 36 and third layer 40 may consist essentially of silicon nitride or consist of amorphous silicon nitride. In some examples in which first layer 36 and third layer 40 include amorphous silicon nitride, first layer 36 and third layer 40 may not include (e.g., be substantially free of) silica.

Second layer 38 may include a second chemical composition that is different than the chemical composition of first layer 36 and third layer 40. For example, when first layer 36 and third layer 40 include amorphous silica, second layer 38 may include, consist essentially of, or consist of amorphous silicon nitride. As another example, when first layer 36 and third layer 40 include amorphous silicon nitride, second layer 38 may include, consist essentially of, or consist of amorphous silica.

As shown in FIG. 2, second layer 38 is between first layer 36 and third layer 40. In this way, layers including a first composition (first layer 36 and third layer 40) alternate with a layer including a second composition (second layer 38). By alternating layers with different compositions, crack mitigation within coating 34 may be reduced, e.g., due to the interfaces between layers 36, 38, and 40. In some examples, by forming coating 34 with multiple layers, the thicknesses of the individual layers may be reduced while providing the same total thickness for coating 34. Using multiple, thinner layers may reduce residual stress in coating 34 (e.g., stress in coating 34 due to the coating process).

Coating 34 may define a total thickness, measured in a direction normal to surface 42 of substrate 32, of between about 0.1 micrometers and about 25 micrometers. For example, coating 34 may define a total thickness of between about 1 micrometer and about 10 micrometers. In some examples, each of layers 36, 38, and 40 defines a thickness, measured in a direction normal to surface 42 of substrate 32, of between about 0.1 micrometer and about 10 micrometers. In some examples, the thickness of each of layers 36, 38, and 40 may be substantially the same (e.g., the same or nearly the same). In other examples, the thickness of at least one of layers 36, 38, and 40 may be different than the thickness of at least another of layers 36, 38, and 40.

Figure 3:
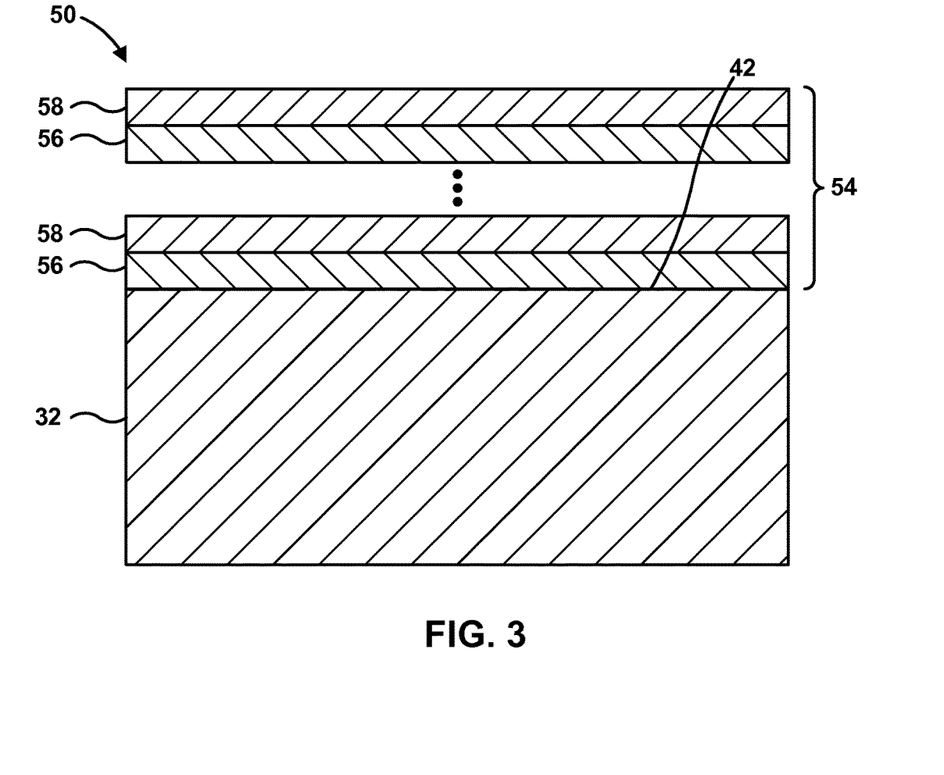
FIG. 3 is a conceptual diagram illustrating a cross-sectional view of another example article that includes a substrate and a coating including alternating layers including amorphous microstructure.

In some examples, instead of including three layers 36, 38, and 40, a coating may include a plurality of layers. FIG. 3 is a conceptual diagram illustrating a cross-sectional view of another example article 50 that includes a substrate 32 and a coating 54 including alternating layers 56 and 58 including amorphous microstructure. In some examples, article 50 may be an example of gas turbine engine disk 12, such as a portion of fir tree recess 18, a diaphragm of gas turbine engine disk 12, or an outer rim of gas turbine engine disk 12.

Substrate 32 may be similar to or substantially the same as described with respect to FIG. 2. For example, substrate 32 may include a superalloy, a ceramic, or a CMC.

Coating 54 is formed on surface 42 of substrate 32. Coating 54 includes a first set of first layer 56 and a second set of second layers 58. As shown in FIG. 3, second layers 58 alternate with first layers 56. In some examples, first layers 56 may each include the same chemical composition, such as amorphous silica or amorphous silicon nitride. Similarly, in some examples, second layers 58 may each include the same chemical composition, such as amorphous silica or amorphous silicon nitride. The chemical composition of first layers 56 may be different than the chemical composition 58 of second layers. In some examples, first layers 56 include, consist essentially of, or consist of amorphous silica and second layers 58 include, consist essentially of, or consist of amorphous silicon nitride. In other examples, first layers 56 include, consist essentially of, or consist of amorphous silicon nitride and second layers 58 include, consist essentially of, or consist of amorphous silicon nitride.

As described with respect to FIG. 2, by alternating layers with different compositions, crack mitigation within coating 54 may be reduced, e.g., due to the interfaces between first layers 56 and second layers 58. In some examples, by forming coating 54 with multiple layers, the thicknesses of the individual layers may be reduced while providing the same total thickness for coating 54. Using multiple, thinner layers may reduce residual stress in coating 54 (e.g., stress in coating 54 due to the coating process).

Coating 54 may define a total thickness, measured in a direction normal to surface 42 of substrate 32, of between about 0.1 micrometers and about 25 micrometers, such as between about 1 micrometer and about 10 micrometers. In some examples, each of first layers 56 and second layers 58 defines a thickness, measured in a direction normal to surface 42 of substrate 32, of between about 0.1 micrometer and about 10 micrometers. In some examples, the thickness of each of first layers 56 and second layers 58 may be substantially the same (e.g., the same or nearly the same). In other examples, the thickness of each of first layers 56 is substantially the same, the thickness of each of second layers 58 is substantially the same, and the thickness of the respective first layers 56 is different than the thickness of the respective second layers 58. In other examples, the thickness of at least one of first layers 56 or second layers 58 may be different than the thickness of at least another of first layers 56 or second layers 58.

In some examples, coatings 34 or 54 may be resistant to mechanical wear due to rubbing between article 30 or 50, respectively, and another component. For example, coatings 34 or 54 may be applied on fir tree recess 18 of gas turbine engine disk 12, and may reduce fretting of gas turbine engine disk 12, gas turbine engine blade 14, or both.

In some examples, coatings 34 or 54 may be applied to other portions of gas turbine engine disk 12. For example, coatings 34 or 54 may be applied to a portion of gas turbine engine disk 12 that is exposed to hot gases during operation of the gas turbine engine. These portions of gas turbine engine disk 21 may include a diaphragm, an outer rim, or both. In some examples, coatings 34 or 54 may provide hot corrosion resistance, oxidation protection, or both to gas turbine engine disk 12.

Figure 4:
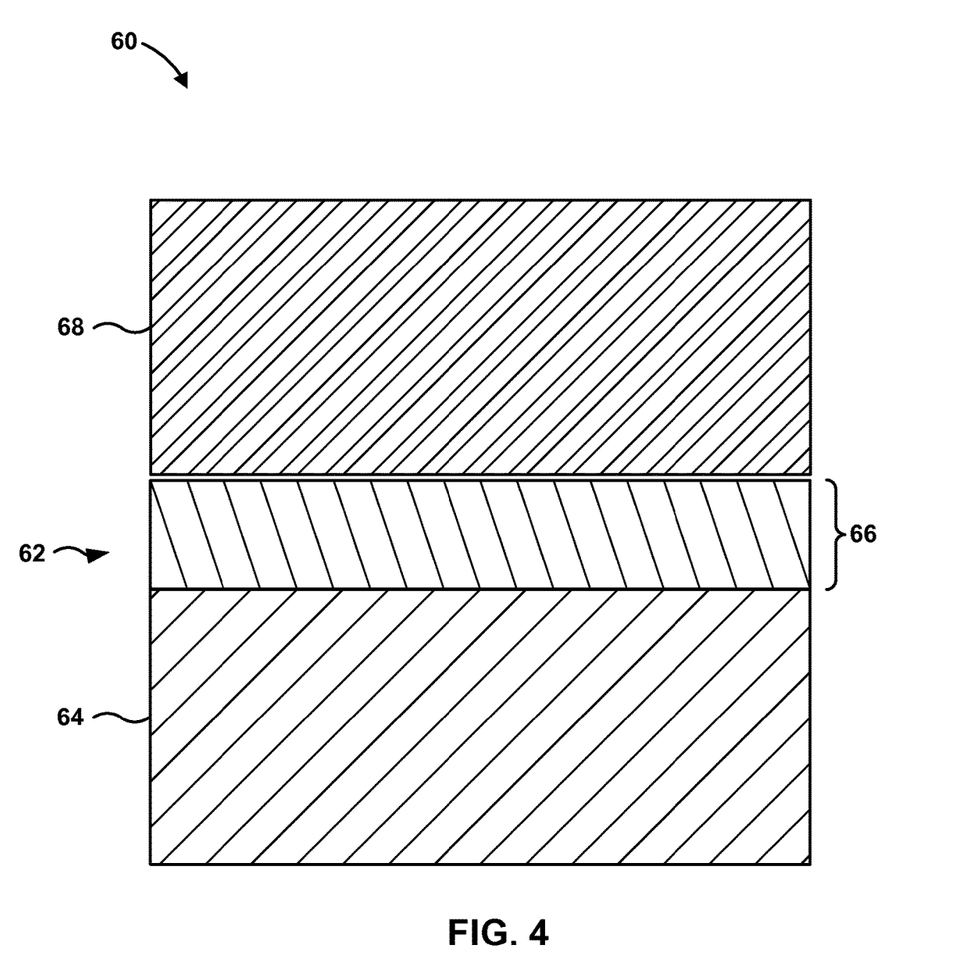
FIG. 4 is a conceptual and schematic block diagram of a system including a first component and a second component that may come into contact with each other.

In some examples, a coating including a plurality of layers of amorphous silica or silicon nitride may form a barrier coating at locations of components that may come into contact with other components. For example, as described with respect to FIGS. 1-3, the coating may be applied to surface of a fir tree recess 18 of a gas turbine engine disk 12. In some examples, the coating may be applied to surfaces of other components that may come into contact with a second component. FIG. 4 is a conceptual and schematic block diagram of a system 60 including a first component 62 and a second component 68 that may come into contact with each other.

First component 62 includes a substrate 64 and a coating 66 on substrate 64. Although not shown in FIG. 4, coating 66 includes a plurality of layers of amorphous material, and may include coating 34 of FIG. 2 or coating 54 of FIG. 3.

Substrate 64 may include any of the materials described above with respect to FIG. 2. For example, substrate 64 may include a superalloy, such as a Ni-based, Co-based, Ti-based, or Fe-based superalloy. As other examples, substrate 64 may include a ceramic material or CMC material. In some examples, in which substrate 64 includes a ceramic material or CMC material, the ceramic material or CMC material may include silicon, either alone or in a compound (e.g., SiC, $Si_3N_4$, or the like).

Second component 68 also may include any of the materials described above with respect to FIG. 2. For example, second component 68 may include a superalloy, such as a Ni-based, Co-based, Ti-based, or Fe-based superalloy. As other examples, second component 68 may include a ceramic material or CMC material. In some examples, in which second component 68 includes a ceramic material or CMC material, the ceramic material or CMC material may include silicon, either alone or in a compound (e.g., SiC, $Si_3N_4$, or the like). Although not shown in FIG. 4, in some examples, second component 68 may include a coating on a substrate.

Substrate 64 of first component 62 and second component 68 may include different chemical compositions. In some examples, substrate 64 may include a superalloy and second component 68 may include a ceramic or a CMC. For example, substrate 64 may include a Ni-based superalloy and second component 68 may include a ceramic of a CMC including Si. In other examples, substrate 64 may include a ceramic of a CMC and second component 68 may include a superalloy. For example, substrate 64 may include a ceramic of a CMC including Si second component 68 may include a Ni-based superalloy.

Coating 66 may reduce or substantially prevent ingress, such as through diffusion, of silicon from the ceramic or the CMC into the superalloy. In some examples, at relatively high operating temperatures (e.g., greater than about 1400° F. (about 760° C.)) and after relatively long times (e.g., greater than about 10,000 hours, nickel and silicon may react and degrade properties and performance of a Ni-based superalloy. Thus, by reducing or substantially preventing ingress of Si into the superalloy, coating 66 may extend a useful life of the superalloy.

In some examples, system 60 including first component 62 and second component 68 may be components of a high temperature mechanical system, such as a gas turbine engine. For example, a CMC blade track may be held by a metallic component, a hybrid turbine vane may include a CMC airfoil and metallic end walls, or a CMC blade may be held by a nickel disk alloy turbine disk.

In some examples, coating 34, 54, and 66 may be formed using chemical vapor deposition (CVD), such as plasma enhanced CVD (PE-CVD). CVD and PE-CVD may be used to deposit at least one amorphous silicon layer, at least one amorphous silicon nitride layer, or both. PE-CVD is a non-line-of-sight process, which may allow deposition of coating 34, 54, or 66 on surfaces with which a line-of-sight cannot be established to the coating materials. For example, PE-CVD may be used to deposit coating 34, 54, or 66 on the surfaces of fir tree recess 18 (FIG. 1).

In some examples, CVD and PE-CVD may allow the substrate 32 or 64 to be maintained at a relatively low temperature during deposition of coating 34, 54, or 66. This may allow deposition of coating 34, 54, or 66 while leaving the microstructure and phase constitution of substrate 32 or 64 substantially unchanged, maintaining the mechanical and chemical properties of substrate 32 or 64. In some examples, the temperature may be less than the processing temperature of substrate 32 or 64. For example, the temperature may be less than about 300° F. (about 149° C.).

EXAMPLES

Example 1

A 1" diameter RR1000 coin was polished using 220 grit SiC to obtain a 30 microinch surface finish, then cleansed with isopropyl alcohol in an ultrasonic bath. An amorphous $SiO_2$ with a thickness of about 5 micrometers was deposited using PE-CVD. The coating was crack free.

Example 2

A 1" diameter RR1000 coin was polished using 220 grit SiC to obtain a 30 microinch surface finish, then cleansed with isopropyl alcohol in an ultrasonic bath. An amorphous $Si_3N_4$ with a thickness of about 5 micrometers was deposited using PE-CVD. The coating was crack free.

Example 3

A 1" diameter RR1000 coin was polished using 220 grit SiC to obtain a 30 microinch surface finish, then cleansed with isopropyl alcohol in an ultrasonic bath. A coating including alternating layers of amorphous $SiO_2$ and amorphous $Si_3N_4$ was deposited using PE-CVD. The coating included six layers, three layers of $SiO_2$ and three layers of $Si_3N_4$. The thickness of each layer was about 0.5 micrometer. A $SiO_2$ layer was adjacent to the substrate, and the top layer was $Si_3N_4$. The coating was crack free.

Various examples have been described. These and other examples are within the scope of the following claims.

The invention claimed is:

1. A gas turbine engine comprising:
a turbine blade comprising a turbine blade root;
a gas turbine engine disk comprising:
a substrate defining at least one fir tree recess; and
a coating on surfaces of a fir tree recess of the at least one fir tree recess;
wherein the coating comprises a first set of layers and a second set of layers;
wherein at least one layer of the first set of layers is between two layers of the second set of layers;
wherein the at least one layer of the first set of layers comprises one of amorphous silica or amorphous silicon nitride;
wherein the at least two layers of the second set of layers comprises the other of amorphous silica or amorphous silicon nitride;
wherein at least one of amorphous silica or amorphous silicon nitride defines an outer surface of the coating; and
wherein the outer surface of the coating contacts a surface of the turbine blade root in the fir tree recess.

2. The article of claim 1, wherein the coating is selectively not on surfaces of the gas turbine disk other than the surfaces of the fir tree recess of the at least one fir tree recess.

3. The article of claim 1, wherein the at least one layer of the first set of layers comprises amorphous silica, and wherein the at least two layers of the second set of the layers comprise amorphous silicon nitride.

4. The article of claim 3, wherein the at least one layer of the first set of layers does not include silicon nitride, and wherein the at least two layers of the second set of layers does not include silica.

5. The article of claim 1, wherein the at least one layer of the first set of layers comprises amorphous silicon nitride, and wherein the at least two layers of the second set of the layers comprise amorphous silica.

6. The article of claim 5, wherein the at least one layer of the first set of layers does not include silica, and wherein the at least two layers of the second set of layers does not include silicon nitride.

7. The article of claim 1, wherein each layer of the first set of layers comprises a first, same composition, and wherein each layer of the second set of layers comprises a second, same composition.

8. The article of claim 1, wherein each layer of the first set of layers and each layer of the second set of layers defines a thickness of between about 0.1 micrometers and about 10 micrometers.

9. A system comprising:
a first component comprising an alloy substrate, the first component defining at least a portion of a fir tree recess of a gas turbine engine disk; and
a second component comprising a ceramic or a CMC substrate, the second component defining at least a portion of a turbine blade root of a turbine blade;
wherein at least a portion of the first component, at least a portion of the second component, or both comprises a coating;
wherein the coating comprises a first set of layers and a second set of layers;
wherein at least one layer of the first set of layers is between two layers of the second set of layers;
wherein the at least one layer of the first set of layers comprises one of amorphous silica or amorphous silicon nitride;
wherein the at least two layers of the second set of layers comprises the other of amorphous silica or amorphous silicon nitride;
wherein at least one of amorphous silica or amorphous silicon nitride defines an outer surface of the coating; and
wherein the outer surface of the coating contacts the other of the first component or the second component.

10. The system of claim 9, wherein the at least one layer of the first set of layers comprises amorphous silica, and wherein the at least two layers of the second set of the layers comprise amorphous silicon nitride.

11. The system of claim 10, wherein the at least one layer of the first set of layers does not include silicon nitride, and wherein the at least two layers of the second set of layers does not include silica.

12. The system of claim 9, wherein the at least one layer of the first set of layers comprises amorphous silicon nitride, and wherein the at least two layers of the second set of the layers comprise amorphous silica.

13. The system of claim 12, wherein the at least one layer of the first set of layers does not include silica, and wherein the at least two layers of the second set of layers does not include silicon nitride.

14. The system of claim 9, wherein each layer of the first set of layers comprises a first, same composition, and wherein each layer of the second set of layers comprises a second, same composition.

15. The system of claim 9, wherein each layer of the first set of layers and each layer of the second set of layers defines a thickness of between about 0.1 micrometers and about 10 micrometers.

16. The system of claim 9, wherein the portion of the first component comprises the coating.

17. The system of claim 9, wherein the portion of the second component comprises the coating.

18. The system of claim 9, wherein both the portion of the first component and the portion of the second component comprises the coating.

19. A method comprising:
- depositing, using at least one of chemical vapor deposition or plasma-enhanced chemical vapor deposition, a plurality of layers comprising an amorphous microstructure on a surface of a fir tree recess of a gas turbine engine disk;
- wherein the plurality of layers comprises a first set of layers and a second set of layers;
- wherein at least one layer of the first set of layers is between two layers of the second set of layers;
- wherein the at least one layer of the first set of layers comprises one of amorphous silica or amorphous silicon nitride;
- wherein the at least two layers of the second set of layers comprises the other of amorphous silica or amorphous silicon nitride;
- wherein at least one of amorphous silica or amorphous silicon nitride defines an outer surface of the coating; and
- wherein the outer surface of the coating contacts a surface of a turbine blade root of a gas turbine engine blade in the fir tree recess.

* * * * *